(12) United States Patent
Voss et al.

(10) Patent No.: US 11,322,626 B2
(45) Date of Patent: May 3, 2022

(54) TUNNEL DRIFT STEP RECOVERY DIODE

(71) Applicants: Lawrence Livermore National Security, LLC, Livermore, CA (US); BAE Systems Land & Armaments L.P., Sterling Heights, MI (US); The Government of the United States, as represented by the Secretary of the Army, Washington, DC (US)

(72) Inventors: Lars F. Voss, Livermore, CA (US); Adam M. Conway, Livermore, CA (US); Luis M. Hernandez, Coon Rapids, MI (US); Mark S. Rader, Huntsville, AL (US)

(73) Assignees: Lawrence Livermore National Security, LLC, Livermore, CA (US); BAE Systems Land & Armaments L.P., Sterling Heights, MI (US); The Government of the United States, as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 17/081,902

(22) Filed: Oct. 27, 2020

(65) Prior Publication Data

US 2021/0126136 A1    Apr. 29, 2021

Related U.S. Application Data

(60) Provisional application No. 62/927,237, filed on Oct. 29, 2019.

(51) Int. Cl.
| *H01L 29/88* | (2006.01) |
| *H01L 29/66* | (2006.01) |
| *H01L 29/36* | (2006.01) |

(52) U.S. Cl.
CPC .............. *H01L 29/88* (2013.01); *H01L 29/36* (2013.01); *H01L 29/66151* (2013.01)

(58) Field of Classification Search
CPC ... H01L 29/88; H01L 29/36; H01L 29/66151; H01L 29/1608; H01L 29/20; H01L 29/66121
See application file for complete search history.

(56) References Cited

U.S. PATENT DOCUMENTS

| 3,527,966 A | 9/1970 | Forge |
| 5,148,267 A | 9/1992 | Ty Tan et al. |

(Continued)

FOREIGN PATENT DOCUMENTS

CN    101777587 A  *  7/2010

OTHER PUBLICATIONS

International Searching Authority, International Search Report and Written Opinion, PCT Patent Application PCT/US2020/057567, dated Jan. 21, 2021, 6 pages.

*Primary Examiner* — Syed I Gheyas
(74) *Attorney, Agent, or Firm* — Perkins Coie LLP

(57) ABSTRACT

Devices, methods and techniques are disclosed for providing a multi-layer diode without voids between layers. In one example aspect, a multi-stack diode includes at least two Drift Step Recovery Diodes (DSRDs). Each DSRD comprises a first layer having a first type of dopant, a second layer forming a region with at least ten times lower concentration of dopants compared to the adjacent layers, and a third layer having a second type of dopant that is opposite to the first type of dopant. The first layer of a second DSRD is positioned on top of the third layer of first DSRD. The first layer of the second DSRD and the third layer of the first DSRD are degenerate to form a tunneling diode at an (Continued)

interface of the first DSRD and second DSRD, the tunneling diode demonstrating a linear current-voltage characteristic.

20 Claims, 4 Drawing Sheets

(56) References Cited

U.S. PATENT DOCUMENTS 5,870,421 A 2/1999 Dahm
2004/0016921 A1 1/2004 Botez et al.

* cited by examiner

TUNNEL DRIFT STEP RECOVERY DIODE

CROSS REFERENCE TO RELATED APPLICATIONS

This patent document claims priority to and benefits of U.S. Provisional Patent Application No. 62/927,237 entitled "TUNNEL DRIFT STEP RECOVERY DIODE" and filed Oct. 29, 2019. The entire contents of the before-mentioned patent application are incorporated by reference as part of the disclosure of this patent document.

STATEMENT REGARDING FEDERALLY SPONSORED RESEARCH

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This document generally relates to diodes, and more particularly to methods and systems for a multi-layer diode without intermediate metallic layers.

BACKGROUND

A diode is a two-terminal electronic component that conducts current primarily in one direction. A diode has low resistance in one direction, and high resistance in the other. A semiconductor junction diode is made of a crystal of semiconductor, usually silicon. Impurities are added to create a region on one side that includes negative charge carriers, called an N-type semiconductor. A region on the other side that includes positive charge carriers is called a P-type semiconductor. The boundary between these two regions called a P-N junction. When a sufficiently higher electrical potential is applied to the P side (the anode) than to the N side (the cathode), the potential allows electrons to flow through the depletion region from the N-type side to the P-type side.

SUMMARY

Devices, methods and techniques are disclosed for providing a multi-layer diode without voids between layers.

In one example aspect, a multi-stack diode includes at least two Drift Step Recovery Diodes (DSRDs). Each DSRD comprises a first layer having a first type of dopant, a second layer forming a region with at least ten times lower concentration of dopants compared to adjacent layers thereto, and a third layer having a second type of dopant that is opposite to the first type of dopant. The first layer of a second DSRD is positioned on top of the third layer of first DSRD. The first layer of the second DSRD and the third layer of the first DSRD are degenerate to form a tunneling diode at an interface of the first DSRD and second DSRD, the tunneling diode demonstrating a linear current-voltage characteristic.

In another example aspect, a method for producing a multi-stack diode includes determining a number of Drift Step Recovery Diodes (DSRDs) in the multi-stack diode. The method includes growing, for each DSRD, a first layer having a first type of dopant, a second layer forming a region with at least ten times lower concentration of dopants compared to adjacent layers thereto, and a third layer having a second type of dopant that is opposite to the first type of dopant. The method also includes repeating the growing until the number of DSRDs are completed. The third layer of a first DSRD and a first layer of an adjacent, second DSRD are degenerate to form a tunneling diode at an interface of the first DSRD and second DSRD, the tunneling diode demonstrating a linear current-voltage characteristic.

The above and other aspects and features of the disclosed technology are described in greater detail in the drawings, the description and the claims.

DETAILED DESCRIPTION

In electronics, a step recovery diode (SRD) is a semiconductor junction diode having the ability to generate extremely short pulses. The SRD has a variety of uses in microwave electronics as pulse generator or parametric amplifier. The Drift Step Recovery Diode (DSRD) was developed for pulsed power applications. The principle of the DSRD operation is similar to the SRD, except that the forward pumping current is pulsed instead of continuous. A short pulse of current is applied in the forward direction of the DSRD effectively charging the P-N junction capacitively. When the current direction reverses, the accumulated charges are removed from the base region. As soon as the accumulated charge decreases to zero, the diode opens rapidly. A high voltage spike can appear due to the self-induction of the diode circuit. The larger the commutation current and the shorter the transition from forward to reverse conduction, the higher the pulse amplitude and efficiency of the pulse generator.

The DSRDs are commonly made of silicon diodes. Other materials, such as gallium arsenide (GaAs) and silicon carbide (SiC), can be used for DSRD as well. The fabrication of DSRDs typically involves deep diffusion of N-type and P-type dopants into a moderately doped silicon wafer to create a PIN diode (a diode that has a P-doped region, an intrinsic (I) region, and an N-doped region). The thickness of the I-region can be in the range of 5 to 50 microns. This thickness is determined based on the speed of the pulse required: narrower regions produce faster pulses but lower peak voltage. In many cases, as part of the fabrication of the device, the diffusion of the dopants can take over a week, resulting in difficulties in controlling the thickness of the I region.

Figure 1:
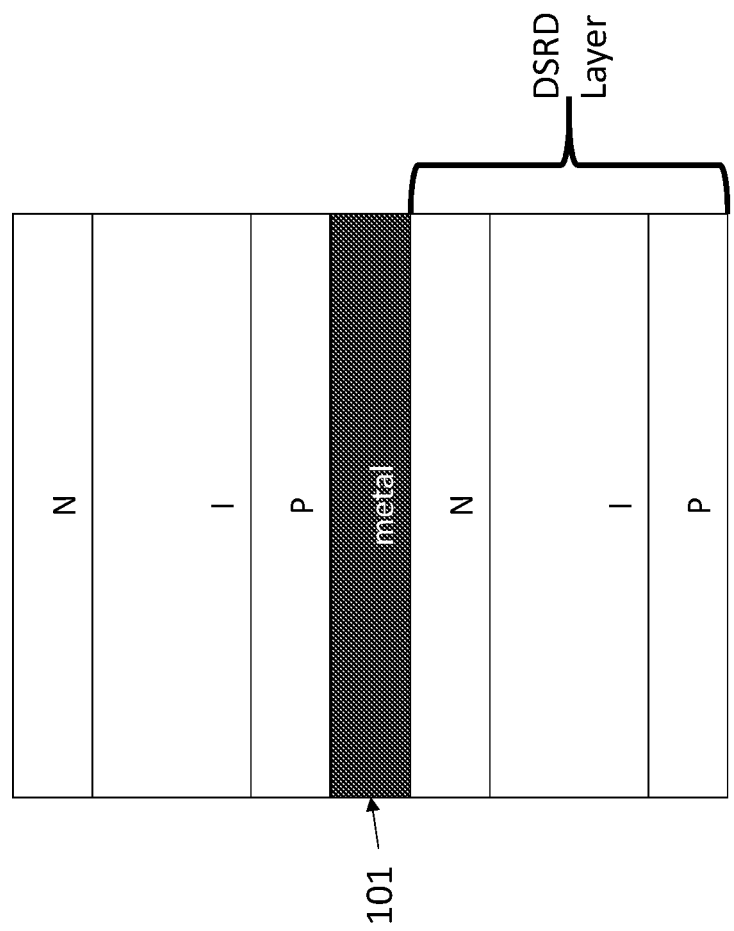
FIG. 1 illustrates an example structure of multi-layer DSRDs that includes intermediate metal layers.

Once individual diodes are produced, they are stacked in series to produce the required peak voltage pulse for a desired application. Stacking of the individual diodes is often performed using die attachment techniques, such as soldering, eutectic bonding, metal diffusion bonding, etc., which require an intermediate metal layer to bond the diodes. FIG. 1 illustrates an example structure 100 of multi-layer DSRDs that includes an intermediate metal layer 101. The addition of the metal layer can result in higher contact resistance between individual diodes, as well as voids at the interface, leading to deleterious performance.

This patent document discloses, among other features and benefits, multi-layer DSRDs and methods for producing the same, without using any intermediate metallic layers, thereby eliminating problems associated with stacking of DSRDs, including voids or other irregularities at the interface adjacent DSRDs. Instead of producing individual layers and then bonding the DSRDs at the metallic layers, the entire stack of multi-layer DSRDs can be formed on a substrate. In some example embodiments, the entire stack can be grown epitaxially on a silicon wafer. Epitaxial growth is a type of crystal growth or material deposition in which new crystalline layers are formed with a defined orientation with respect to the substrate. The grown structure can have different regions that follow one another, such as N/I/P/N/I/P/N/I/P or P/I/N/P/I/N/P/I/N structure, in which each group of N/I/P or P/I/N regions forms an individual DSRD. Growing the entire stack can provide better control of the layer thickness and reduce the fabrication time as compared to the diffusion process. The fabrication cost can also be greatly reduced to around $10-$150 per die as compared to around $500-$1000 per die using the conventional techniques.

Figure 2:
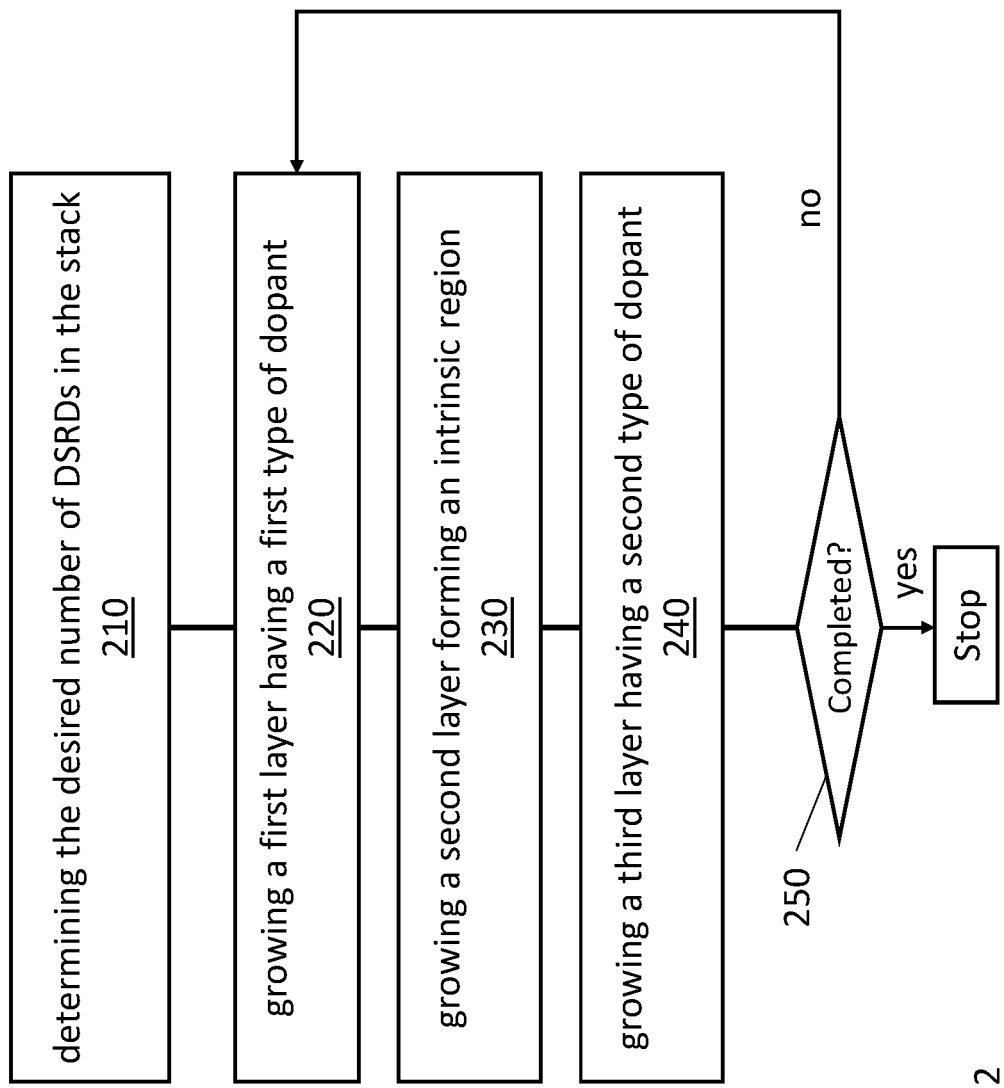
FIG. 2 is a flowchart representation of a method for producing a plurality of multi-layer diodes in accordance with the present disclosure.

FIG. 2 is a set of operations 200 for producing a plurality of multi-layer diodes (e.g., Drift Step Recovery Diodes) in accordance with an example embodiment. The set of operations 200 includes, at operation 210, determining the desired number of DSRDs in the stack. The number of DSRDs should be greater than or equal to 2. For each DSRD, the operations 200 includes growing a first layer having a first type of dopant (220), growing a second layer forming an intrinsic region (230), and growing a third layer having a second type of dopant that is opposite to the first type of dopant (240). It should be noted that while in this patent document the term intrinsic region has been used that typically refers to an undoped region, the region that is positioned between the two doped regions does not need to be an undoped intrinsic region but rather it may be a region with a considerably lower doping concentration, such as at least 10 times lower doping concentration, compared to its adjacent layers. The layers can be grown epitaxially on a substrate, such as a silicon wafer. The first type of dopant can be p-type dopant while the second type of dopant is n-type dopant. Alternatively, the first type of dopant can be n-type dopant while the second type of dopant is p-type dopant. The set of operations 200 also includes incrementing a count of the number of DSRDs after all three layers are completed and determining whether the desired number of DSRDs has been completed (250). If not, operations 220-240 can be repeated. If yes, the fabrication process can be terminated.

In addition, the set of operations 200 can further include doping the layers positioned at the interface of two DSRDs to create a tunneling diode. Because the first type and the second type of dopant are opposite to each other, the third layer of the first DSRD (e.g., p-type dopant) and the first layer of the second DSRD (e.g., n-type dopant) form a p-n junction diode. However, additional doping at the interface can change the p-n junction diode to a tunneling diode that demonstrates a linear current-voltage characteristic. The tunneling diode can thus behave more like a metal, thereby eliminating the need of introducing a metallic layer and any undesired voids between the DSRDs. In some embodiments, the tunneling diode has a doping concentration of at least $1 \times 10^{18}$ cm$^{-3}$ and preferably higher than $5 \times 10^{19}$ cm$^{-3}$.

In some embodiments, the doping of the interface regions comprises adjusting a doping concentration of the first type dopant and the doping concentration of the second type dopant. The concentration can be adjusted from a first concentration level (e.g., a peak concentration) to a second concentration level. In some embodiments, adjusting the doping concentration comprises adjusting the doping concentration of the third layer of the first DSRD and the doping concentration of the first layer of the second DSRD to gradually approach the second concentration level that is substantially equal to doping concentration level of the second layer.

In some embodiments, after the doping, the tunneling diode can achieve a reverse breakdown voltage equal to or lower than 200 meV. In some embodiments, the method further includes introducing one or more defects to the tunneling diode to allow a current to flow through the tunneling diode regardless of a bias polarity. In some embodiments, the grown structure is further subject to a diffusion process in order to produce the desired gradual doping profile from N-region to I-region and from I-region to P-region in order to maximize breakdown voltage.

The method as shown in FIG. 2 can greatly simplify the fabrication of DSRDs and provide superior performance, as the stack is essentially monolithic without any voids introduced at the bonding time. In some embodiments, instead of growing the entire stack of the multi-layer DSRDs on the substrate, individual layers can be grown first. After the growth is complete, one region of each individual layer doped at a high concentration level. The layers are then bonded using direct silicon bonding techniques such that the doped opposite regions (doped P/N or N/P) form a tunneling diode that demonstrates a linear current-voltage characteristic.

Figure 3:
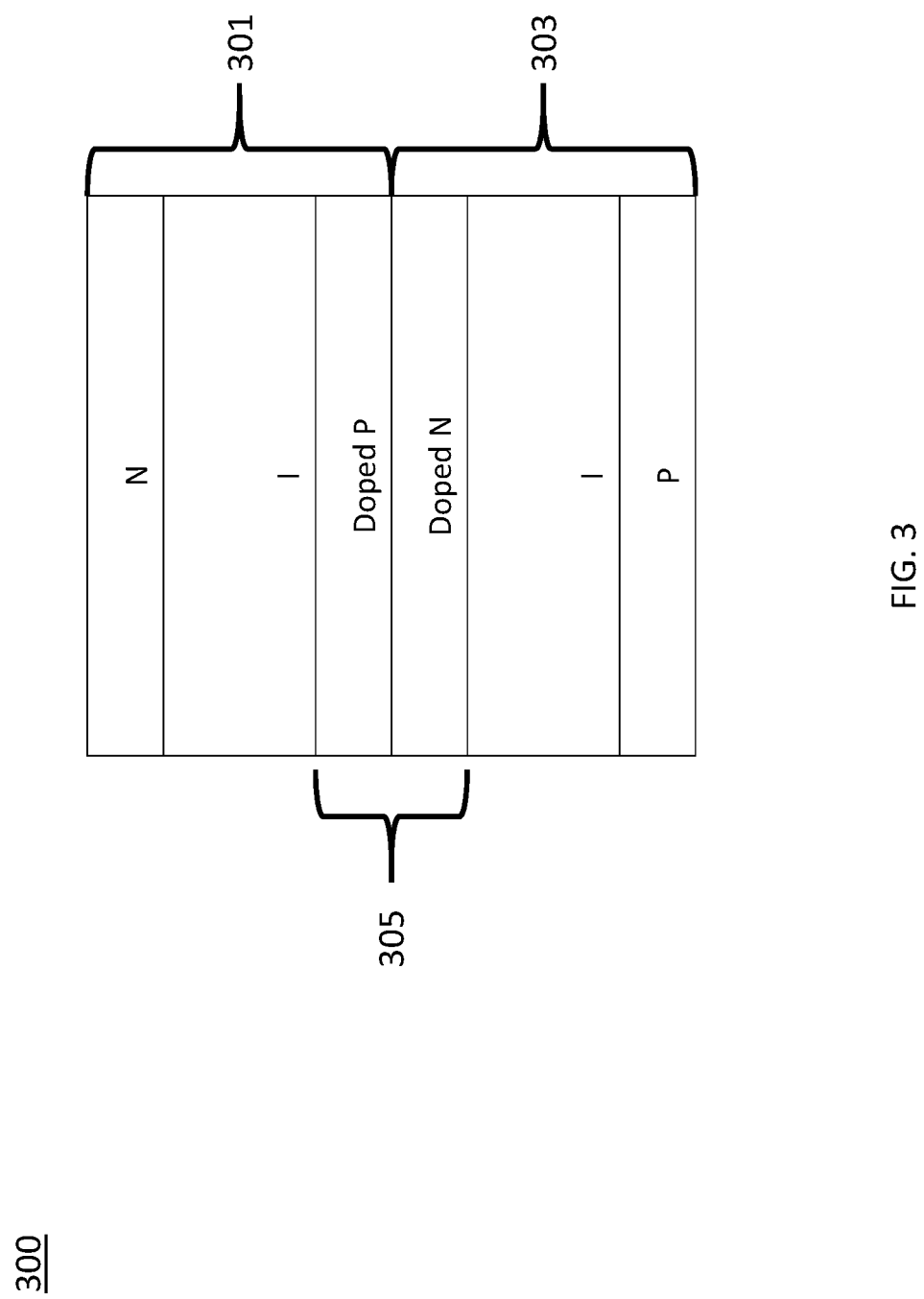
FIG. 3 illustrates an example structure of a stack of diodes in accordance with the present disclosure.

FIG. 3 illustrates an example structure of a stack of diodes 300 (e.g., Drift Step Recovery Diode) in accordance with the present disclosure. The depicted diode illustrates a structure with two DSRDs for illustration purposes, but it is understood that the structure can be modified to include additional DSRDs as needed. As described above, the stack 300 can be produced by growing the entire stack epitaxially on a substrate, such as a wafer. In this example, the stack 300 comprises two DSRDs (301 and 302). Each DSRD includes a P-region, and I-region, and an N-region. The DSRDs can be arranged as P/I/N/P/I/N/ . . . or alternatively as N/I/P/N/I/P/ . . . so that two opposite regions (N/P or P/N) are in contact with each other at the interface between two DSRDs. The adjacent opposite regions are heavily doped to form a tunneling diode 305. Heavy doping of the tunneling diode creates degenerate regions such that the tunneling diode demonstrates a linear current-voltage characteristic (that is, it can behave more like a metal rather than a semiconductor). In some embodiments, the tunneling diode has a doping concentration in a range between $1 \times 10^{18}$ cm$^{-3}$ to $1 \times 10^{20}$ cm$^{-3}$. In some embodiments, the doping concentration is preferably higher than $5 \times 10^{19}$ cm$^{-3}$. In some embodiments, the reverse breakdown voltage of the tunneling diode is around 200 meV or lower. The lower breakdown voltage allows for a minor increase in the total turn on voltage of the DSRD in forward bias. For example, each DSRD can turn on at around 700 meV (e.g., 650 meV to 750 meV) and each tunneling diode can break down at much lower voltage than 700 meV (e.g., 180 meV to 250 meV). Because there is no void at the interface of two adjacent DSRDs, the resulting multi-layer DSRDs can offer superior performance as compared to conventional DSRDs.

Figure 4:
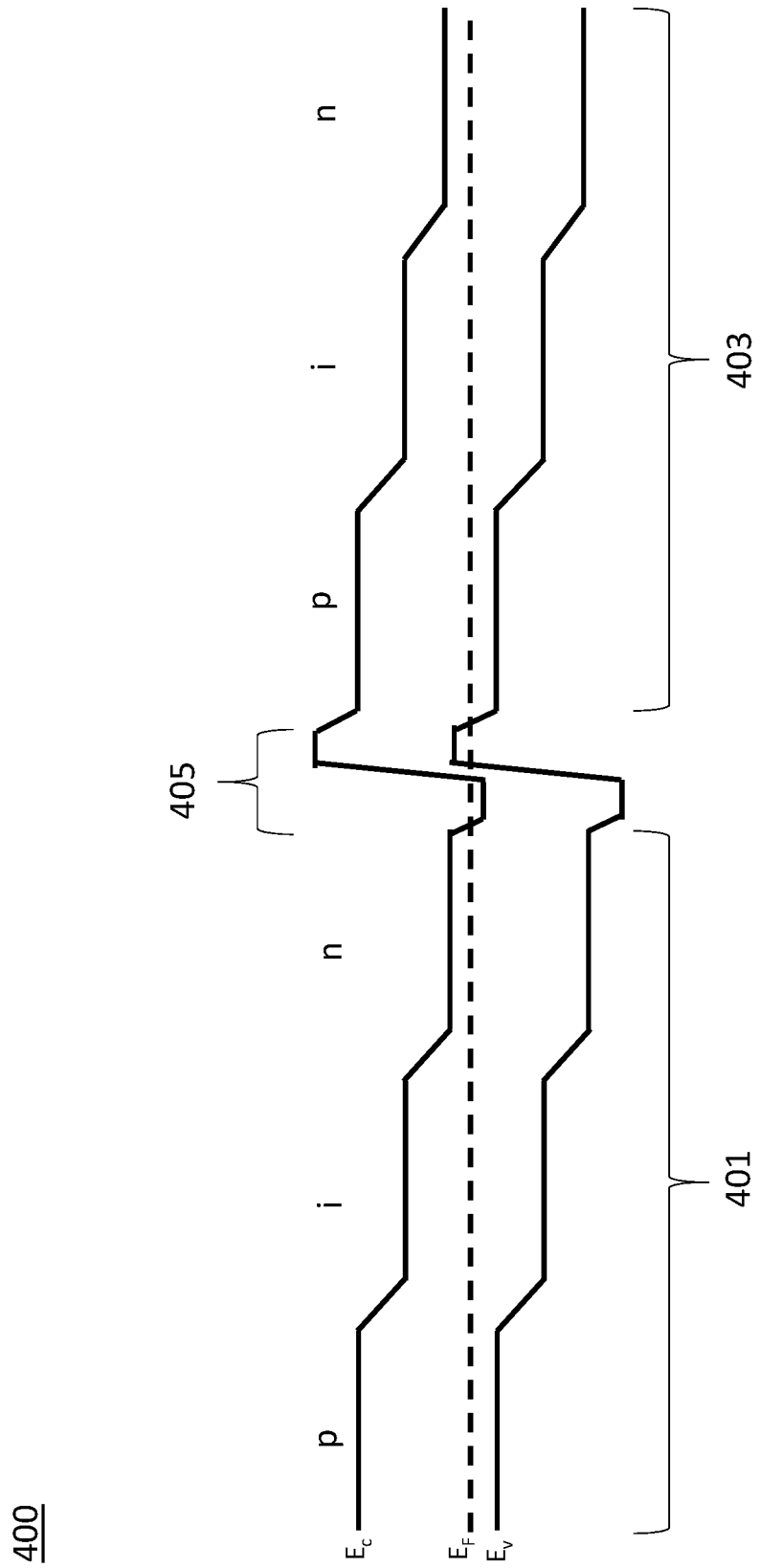
FIG. 4 illustrates an example band diagram of a stack of diodes in accordance with the present disclosure.

FIG. 4 illustrates an example band diagram of a stack of diodes in accordance with the present disclosure. The depicted band diagram shows energy bands of two DSRDs for illustration purposes, but it is understood that the structure can be modified to include additional DSRDs as needed. As shown in FIG. 4, P-regions, I-regions, and N-regions of the first DSRD 401 and the second DSRD 403 show an energy gap between the conduction band edge, denoted as Ec, and the valence band edge, denoted as Ev. The Fermi energy level, denoted as Ef, is illustrated by the dotted line. In the section of the figure designating the tunneling diode 405, at the interface of the two DSRDs 401 and 403, the valance and conduction bands overlap each other, allowing operation with a reverse breakdown voltage that is 200 meV or lower.

In one example aspect, a multi-stack diode is disclosed. The multi-stack diode includes at least two drift step recovery diodes (DSRDs). Each DSRD includes a first layer having a first type of dopant, a second layer forming a region with at least ten times lower concentration of dopants compared to adjacent layers thereto, and a third layer having a second type of dopant that is opposite to the first type of dopant. The first layer of a second DSRD is positioned on top of the third layer of a first DSRD, and the first layer of the second DSRD and the third layer of the first DSRD are degenerate to form a tunneling diode at an interface of the first DSRD and the second DSRD. The tunneling diode demonstrates a linear current-voltage characteristic.

In some embodiments, the first layer of the second DSRD comprises a degenerate P-type region and the third layer of the first DSRD comprises a degenerate N-type region. In some embodiments, the third layer of the second DSRD comprises a N-type region and the first layer of the first DSRD comprises a P-type region. In some embodiments, the first layer of the second DSRD comprises a degenerate N-type region and the third layer of the first DSRD comprises a degenerate P-type region. In some embodiments, the third layer of the second DSRD comprises a P-type region and the first layer of the first DSRD comprises a N-type region.

In some embodiments, the tunneling diode is doped at a doping concentration in a range of $1\times10^{18}$ $cm^{-3}$ to $1\times10^{20}$ $cm^{-3}$. In some embodiments, the tunneling diode is doped at a doping concentration higher than $5\times10^{19}$ $cm^{-3}$. In some embodiments, the tunneling diode has a reverse breakdown voltage equal to or lower than 200 meV. In some embodiments, each of the at least two DSRDs is operable to turn on at a voltage between 650 meV to 750 meV, and the tunneling diode is operable to break down at a voltage between 180 meV to 250 meV.

In another example aspect, a method for producing a multi-stack diode is disclosed. The method includes determining a number of Drift Step Recovery Diodes (DSRDs) in the multi-stack diode, and growing, for each DSRD, a first layer having a first type of dopant, a second layer forming a region with at least ten times lower concentration of dopants compared to adjacent layers thereto, and a third layer having a second type of dopant that is opposite to the first type of dopant. The method also includes repeating the growing until the number of DSRDs are completed. The third layer of a first DSRD and the first layer of an adjacent, second DSRD are degenerate to form a tunneling diode at an interface of the first DSRD and the second DSRD. The tunneling diode demonstrates a linear current-voltage characteristic.

In some embodiments, the first layer of the second DSRD comprises a degenerate P-type region and the third layer of the first DSRD comprises a degenerate N-type region. In some embodiments, the third layer of the second DSRD comprises a N-type region and the first layer of the first DSRD comprises a P-type region. In some embodiments, the first layer of the second DSRD comprises a degenerate N-type region and the third layer of the first DSRD comprises a degenerate P-type region. In some embodiments, the third layer of the second DSRD comprises a P-type region and the first layer of the first DSRD comprises a N-type region. In some embodiments, the growing is performed by epitaxial growth.

In some embodiments, the method further includes adjusting a doping concentration of the third layer of the first DSRD and a doping concentration of the first layer of the second DSRD from a first concentration level to a second concentration level. In some embodiments, adjusting the doping concentration comprises adjusting the doping concentration of the third layer of the first DSRD and the doping concentration of the first layer of the second DSRD to gradually approach the second concentration level that is substantially equal to a doping concentration level of the second layer.

In some embodiments, the tunneling diode is doped at a doping concentration in a range of $1\times10^{18}$ $cm^{-3}$ to $1\times10^{20}$ $cm^{-3}$. In some embodiments, the tunneling diode has a reverse breakdown voltage equal to or lower than 200 meV. In some embodiments, the method includes introducing one or more defects to the tunneling diode to allow a current to flow through the tunneling diode regardless of a bias polarity.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. A multi-stack diode comprising at least two drift step recovery diodes (DSRDs), each DSRD comprising:
   a first layer having a first type of dopant,
   a second layer forming a region with at least ten times lower concentration of dopants compared to adjacent layers thereto, and
   a third layer having a second type of dopant that is opposite to the first type of dopant,
   wherein the first layer of a second DSRD is positioned on top of the third layer of a first DSRD, and wherein the first layer of the second DSRD and the third layer of the first DSRD are degenerate to form a tunneling diode at an interface of the first DSRD and the second DSRD, the tunneling diode demonstrating a linear current-voltage characteristic.

2. The multi-stack diode of claim 1, wherein the first layer of the second DSRD comprises a degenerate P-type region and the third layer of the first DSRD comprises a degenerate N-type region.

3. The multi-stack diode of claim 2, wherein the third layer of the second DSRD comprises a N-type region and the first layer of the first DSRD comprises a P-type region.

4. The multi-stack diode of claim 1, wherein the first layer of the second DSRD comprises a degenerate N-type region and the third layer of the first DSRD comprises a degenerate P-type region.

5. The multi-stack diode of claim 4, wherein the third layer of the second DSRD comprises a P-type region and the first layer of the first DSRD comprises a N-type region.

6. The multi-stack diode of claim 1, wherein the tunneling diode is doped at a doping concentration in a range of $1 \times 10^{18}$ cm$^{-3}$ to $1 \times 10^{20}$ cm$^{-3}$.

7. The multi-stack diode of claim 1, wherein the tunneling diode is doped at a doping concentration higher than $5 \times 10^{19}$ cm$^{-3}$.

8. The multi-stack diode of claim 1, wherein the tunneling diode has a reverse breakdown voltage equal to or lower than 200 meV.

9. The multi-stack diode of claim 1, wherein each of the at least two DSRDs is operable to turn on at a voltage between 650 meV to 750 meV, and wherein the tunneling diode is operable to break down at a voltage between 180 meV to 250 meV.

10. A method for producing a multi-stack diode, comprising:
   determining a number of Drift Step Recovery Diodes (DSRDs) in the multi-stack diode,
   growing, for each DSRD:
      a first layer having a first type of dopant,
      a second layer forming a region with at least ten times lower concentration of dopants compared to adjacent layers thereto, and
      a third layer having a second type of dopant that is opposite to the first type of dopant; and
   repeating the growing until the number of DSRDs are completed, wherein the third layer of a first DSRD and the first layer of an adjacent, second DSRD are degenerate to form a tunneling diode at an interface of the first DSRD and the second DSRD, the tunneling diode demonstrating a linear current-voltage characteristic.

11. The method of claim 10, wherein the first layer of the second DSRD comprises a degenerate P-type region and the third layer of the first DSRD comprises a degenerate N-type region.

12. The method of claim 11, wherein the third layer of the second DSRD comprises a N-type region and the first layer of the first DSRD comprises a P-type region.

13. The method of claim 10, wherein the first layer of the second DSRD comprises a degenerate N-type region and the third layer of the first DSRD comprises a degenerate P-type region.

14. The method of claim 12, wherein the third layer of the second DSRD comprises a P-type region and the first layer of the first DSRD comprises a N-type region.

15. The method of claim 10, wherein the growing is performed by epitaxial growth.

16. The method of claim 10, further comprising:
   adjusting a doping concentration of the third layer of the first DSRD and a doping concentration of the first layer of the second DSRD from a first concentration level to a second concentration level.

17. The method of claim 16, wherein adjusting the doping concentration comprises adjusting the doping concentration of the third layer of the first DSRD and the doping concentration of the first layer of the second DSRD to gradually approach the second concentration level that is substantially equal to a doping concentration level of the second layer.

18. The method of claim 10, wherein the tunneling diode is doped at a doping concentration of at least $1 \times 10^{18}$ cm$^{-3}$.

19. The method of claim 10, wherein the tunneling diode has a reverse breakdown voltage equal to or lower than 200 meV.

20. The method of claim 10, comprising:
   introducing one or more defects to the tunneling diode to allow a current to flow through the tunneling diode regardless of a bias polarity.

* * * * *